United States Patent [19]

Buzawa et al.

[11] 3,917,399

[45] Nov. 4, 1975

[54] CATADIOPTRIC PROJECTION PRINTER

[75] Inventors: M. John Buzawa, Rochester; Charles R. Munnerlyn, Fairport, both of N.Y.

[73] Assignee: Tropel, Inc., Fairport, N.Y.

[22] Filed: Oct. 2, 1974

[21] Appl. No.: 511,219

[52] U.S. Cl. ...................... 355/43; 355/45; 355/71; 356/114; 356/172

[51] Int. Cl.² ..................... G03B 27/52; G03B 27/70; G01J 4/00; G01B 11/26

[58] Field of Search ............ 355/40, 43, 45, 66, 71; 356/114, 138, 152, 153, 167, 171, 172

[56] References Cited

UNITED STATES PATENTS

| | | | |
|---|---|---|---|
| 3,695,758 | 10/1972 | Tanaka | 355/71 |
| 3,698,808 | 10/1972 | Delmas | 355/45 |
| 3,712,740 | 1/1973 | Hennings | 356/152 |
| 3,718,396 | 2/1973 | Hennings | 355/43 |
| 3,794,421 | 2/1974 | Kano et al. | 355/45 |
| 3,819,265 | 6/1974 | Feldman et al. | 355/66 X |
| 3,853,398 | 12/1974 | Kano | 355/43 |
| 3,865,483 | 2/1975 | Wojcik | 355/43 |

*Primary Examiner*—Richard A. Wintercorn
*Attorney, Agent, or Firm*—Stonebraker, Shepard & Stephens

[57] ABSTRACT

An improved projection printer prints a circuitry pattern from a reticle onto a wafer by using a mercury arc source, a beam splitter, and a focusing mirror. The beam splitter is a polarizing beam splitter, and a polarization altering means is arranged between the polarizing beam splitter and the focusing mirror, allowing the radiant energy reflected from the focusing mirror to pass straight through the polarizing beam splitter to the wafer being printed. A system for optically registering the wafer and the reticle includes a source of visible radiant energy of a longer wavelength range and a microscope arranged for observing the reticle. The visible radiant energy is polarized and directed to the polarizing beam splitter in an orientation to pass straight through the beam splitter and be incident on the wafer. The visible radiant energy reflected from the wafer to the focusing mirror and back to the polarizing beam splitter has its polarization altered to be split be the polarizing beam splitter for imaging the wafer on the reticle for viewing through the microscope.

15 Claims, 1 Drawing Figure

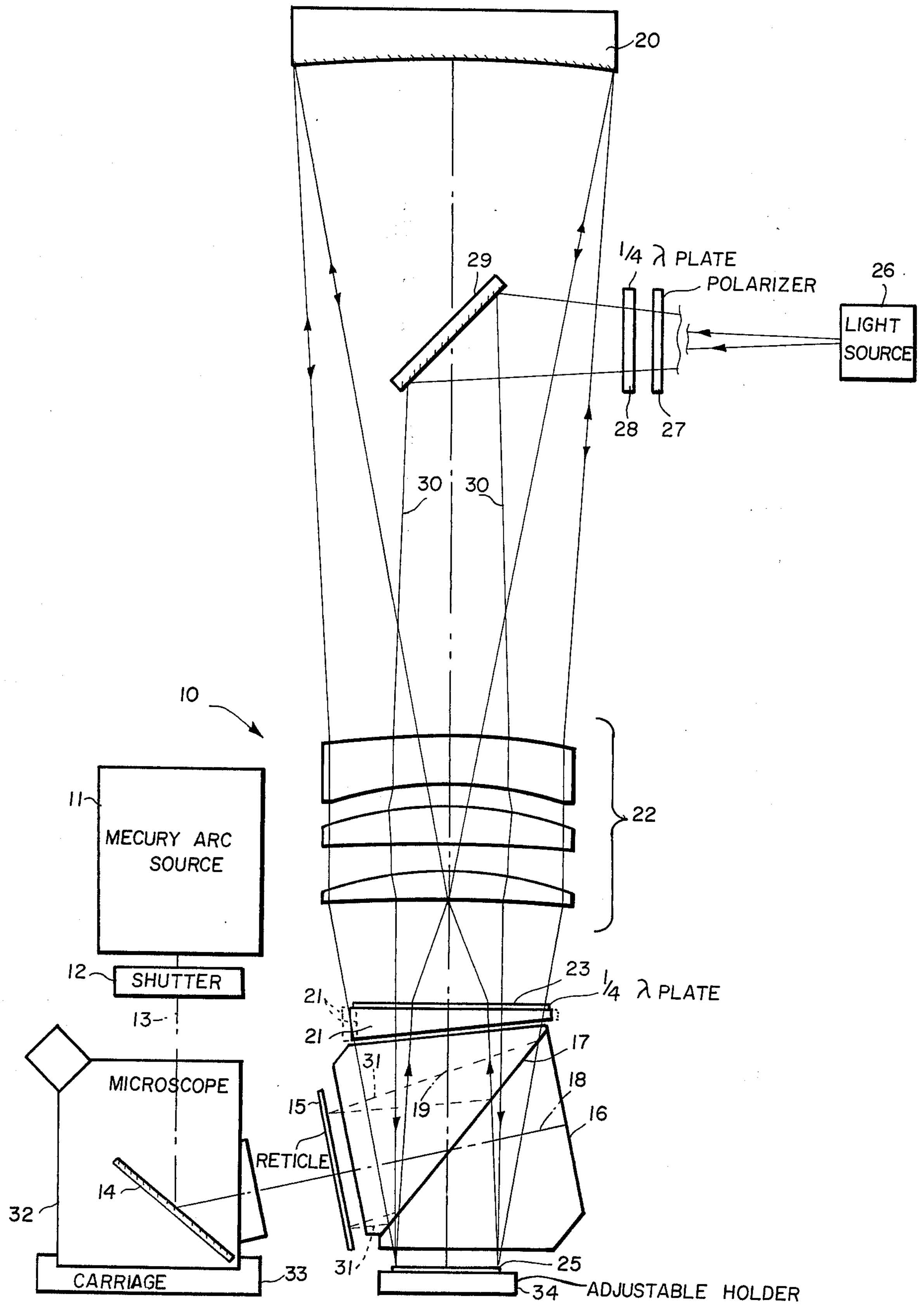
20
29
1/4 λ PLATE
POLARIZER
26
LIGHT SOURCE
28
27
30
30
10
11
MECURY ARC SOURCE
22
12
SHUTTER
23
1/4 λ PLATE
21
21
13
17
MICROSCOPE
31
18
15
19
16
RETICLE
14
32
31
25
CARRIAGE
33
34
ADJUSTABLE HOLDER

CATADIOPTRIC PROJECTION PRINTER

THE INVENTIVE IMPROVEMENT

Small printed circuits or microcircuits are printed on silicon wafers using photoresist materials, and the circuits are becoming more complicated with finer components and larger total areas. The present commercial way of making such circuits is by contact printing through a reticle laid over a wafer and exposed to a large quantity of light from a mercury arc lamp to expose a layer of photoresist material on the wafer, and the circuitry is built up layer upon layer, all in careful registry.

One of the materials used as an insulator on the circuit wafers is silicon monoxide which occasionaly forms spikes that stick up from the surface of the wafer. When a reticle is laid over such a spike, the spike damages the reticle and probably spoils the circuitry, and if the reticle damage isn't detected, further prints from the reticle are also defective. Presently such defects are discovered statistically by testing and the reticles are checked regularly and discarded frequently. Since each reticle may cost from $20 to $25, and since it can only be used a few hours without being scratched or damaged by a spike, reticle replacement is expensive and troublesome.

There have been several suggestions for projection printing through the reticle onto the wafer to keep the reticle out of contact with the wafer being printed, but because of various problems, none of these suggestions has yet proven to be commercially successful. The problems involve the high accuracy required, difficulty in registering the reticle and the wafer, and problems with different wavelengths of light relative to sufficient radiant energy to make the exposure time relatively short.

The invention involves recognition of the many problems involved in projection printing of microcircuits and realization of a way that a combination of components can cooperate to solve all the problems in a practical and efficient way. The invention aims at accuracy, reliability, reasonably low cost, and general efficiency in projection printing of microcircuits to avoid the problems and expense of contact printing of such circuits with the necessity of frequent reticle replacement.

SUMMARY OF THE INVENTION

The inventive catadioptric projection printer is used for printing a circuitry pattern from a reticle onto a wafer and includes an ultra violet source of radiant energy, a beam splitter, a focusing mirror, and means for mounting and optically registering the reticle and the wafer respectively in the input and output regions of the beam splitter. The beam splitter is a polarizing beam splitter directing a polarized portion of the radiant energy toward the focusing mirror. A polarization altering means is arranged between the polarizing beam splitter and the focusing mirror for altering the polarization of the radiant energy so that the radiant energy reflected back from the focusing mirror is oriented to pass straight through the polarizing beam splitter to the wafer. A multi-element corrective lens is arranged between the polarizing beam splitter and the focusing mirror for correcting chromatic and spherical aberration, astigmatism and field curvature, and directing the radiant energy reflected from the focusing mirror substantially telecentrically onto the wafer. The polarizing beam splitter, the polarization altering means, and the lens are selected for substantially transmitting radiant energy throughout the near ultra violet and visible spectrum. The optical registering means includes a polarized source of visible radiant energy and a microscope arranged for observing the reticle. The visible radiant energy is directed toward the polarizing beam splitter to pass through the polarization altering means in an orientation to pass straight through the polarizing beam splitter to be telecentrically incident on the wafer. The visible radiant energy reflected from the wafer to the focusing mirror and reflected back from the focusing mirror is oriented by the polarization altering means to be split by the polarizing beam splitter so as to image the wafer on the reticle for viewing through the microscope. Adjustable means for varying the optical length of the path between the focusing mirror and the wafer accommodates different wavelengths of the radiant energy from the ultra violet source and the visible source so that registration adjustments can be made between the wafer and the reticle. Then the optical path length is adjusted for a print, and light from the ultra violet source is directed through the reticle for imaging the reticle on the wafer. D

DRAWINGS

The drawing schematically shows an elevational view of one preferred embodiment of the inventive printer.

DETAILED DESCRIPTION

The components of the preferred embodiment of the catadioptric projection printer 10 shown schematically in the drawing will be described briefly, and then the relationship of the components to each other and the operation of the printer will be described.

A mercury arc source 11 of ultra violet radiant energy is directed through a shutter 12 along an axis 13 and is directed by mirror 14 through a reticle 15 and into a polarizing beam splitter 16. Beam splitter prism 16 preferably has a non-square configuration as illustrated, so that the radiant energy from source 11 is incident on the coated splitting plane 17 at an angle of more than 45°. The radiant energy is split approximately in half at plane 17 and an unused portion passes through polarizing beam splitter 16 along axis 18, and a polarized portion is directed upward along axis 19 toward focusing mirror 20. Between polarizing beam splitter 16 and focusing mirror 20 are arranged an adjustable optical wedge 21, a multi-element lens 22, and a quarter-wave plate 23. Polarizing beam splitter 16, wedge 21, lens 22, and plate 23, and all the coatings on such components are all selected for substantially transmitting radiant energy throughout a wavelength range of 3600 a.u. to 6500 a.u. to accommodate not only the ultra violet and near ultra violet wavelength range of the mercury arc source 11, but the wavelength range of a visible radiant energy registration system described below.

Lens 22 is designed to correct for chromatic and spherical aberration, astigmatism and field curvature, and for directing the radiant energy reflected from focusing mirror 20 back through quarter-wave plate 23 and polarizing beam splitter 16 telecentrically onto wafer 25 for imaging reticle 15 on wafer 25. The radiant energy reflected back from focusing mirror 20 is not split by polarizing beam splitter 16, because the upward and downward passage of such radiant energy through quarter-wave plate 23 alters the polarization of the radiant energy so that it passes straight through the splitting plane 17 of polarizing beam splitter 16, and this insures that about half of the total energy available is directed onto wafer 25 for a reasonably short interval exposure.

Printer 10 also includes an optical system for registering reticle 15 and wafer 25 for each exposure, and the registration system includes a source 26 of visible radiant energy preferably within a wavelength range of 5000 a.u. to 6500 a.u. and preferably of a broad enough wavelength range to allow some color vision. Light from source 26 is circularly polarized by passage through a polarizer 27 and a quarter-wave plate 28 and is directed onto a preferably retractable mirror 29 that is preferably eccentric to axis 19. The light from mirror 29, represented by cone 30, is directed downward through lens 22 and is plane polarized by quarter-wave plate 23 at a proper orientation for passing straight through polarizing beam splitter 16 to be substantially telecentrically incident on wafer 25.

The light reflected from wafer 25 is somewhat diffuse and scattered because of the unevenness of the surface of wafer 25 and, because of its polarization orientation, passes straight upward through polarizing beam splitter 16 without being substantially split and proceeds toward focusing mirror 20. The light reflected from focusing mirror 20 passes back down toward polarizing beam splitter 16, and the upward and downward passes of the light reflected from wafer 25 are altered in polarization by about 90° by quarter-wave plate 23 so that about half of the light reflected back from mirror 20 is split by polarizing beam splitter 16 at plane 17 as represented by broken lines 31 to be directed onto reticle 15. This images wafer 25 on reticle 15, and the result is viewed in microscope 32 that is preferably mounted on a carriage 33 with mirror 14. Then either reticle 15 or wafer 25 is adjusted to achieve the desired registration, and an adjustable holder 34 can be used for positioning wafer 25.

Mounting microscope 32 and mirror 14 together on carriage 33 allows either microscope viewing of reticle 15 in one position of carriage 33 or directing radiant energy from source 11 through reticle 15 by mirror 14 in another position of carriage 33. To register wafer 25 with reticle 15, microscope 32 is positioned in front of reticle 15, and when registration is achieved, microscope 32 is moved out of the way, and the image of reticle 15 is exposed on wafer 25 by radiant energy from source 11. It may also be possible to provide a fixed microscope and mirror-filter system directing the different wavelengths of light as desired and eliminating the need to move the microscope.

Optical wedge 21 preferably has three positions, including the solid line position and both broken line positions. Wedge 21 then adjusts the length of the optical path from polarizing beam splitter 16 to focusing mirror 20 to accommodate the different wavelengths of radiant energy from sources 11mm and 26. Also, different photoresist materials to be exposed on wafer 25 are sensitive to different wavelengths of light from mercury arc source 11, and wedge 21 is adjusted between two positions for one type of photoresist material sensitive to the energy peak at 3650 a.u. from source 11 for one photoresist material and to another position for the 4047 a.u. and 4358 a.u. energy peaks from source 11 for another type of photoresist material. Different thicknesses of glass plates can be substituted for wedge 21, and the length of the optical path can be adjusted by inserting the proper plate in position. Also, the components in the optical system can be arranged in different places. For example, quarter-wave plate 23 can be located on the other side of wedge 21. A three-quarter-wave plate can be substituted for quarter-wave plate 23, and will have approximately the same effect in altering the polarization of the radiant energy passing through.

A full sequence of events in printer 10 begins with placing the proper reticle 15 in position in the input region of polarizing beam splitter 16 and placing a wafer 25 to be printed on adjustable holder 34 in the output region of polarizing beam splitter 16. Carriage 33 is adjusted to position microscope 32 for viewing reticle 15, and light source 26 is energized to provide visible radiant energy for observing the registration between reticle 15 and wafer 25. Light from source 26 in the preferred wavelength range of 5000 a.u. to 6500 a.u. does not expose the photoresist material coated on wafer 25. Wedge 21 is adjusted to the proper position for the longer wavelength of visible light from source 26, and mirror 29 is positioned eccentrically of axis 19 under focusing mirror 20 to direct the visible light downward in a cone 30. Alternatively, mirror 29 can be left in position and source 26 simply unshuttered. Since the optical elements in printer 10 are designed to transmit and image substantially all radiant energy throughout a wavelength range of 3600 a.u. to 6500 a.u., light cone 30 passes through lens 22 and the other optical elements to form a satisfactory image. Quarter-wave plate 23 plane polarizes the visible light in an orientation predetermined by the orientation of polarizer 27 and quarter-wave plate 28 so that light cone 30 passes straight through polarizing beam splitter 16 and is telecentrically incident on wafer 25 in the same way that printing light from source 11 is telecentrically incident on wafer 25 for exposing the photoresist material.

The visible light reflected from wafer 25 is used for imaging wafer 25 on reticle 15. This light is polarized for passing straight up through beam splitter 16, but is scattered by the unevenness of the surface of wafer 25 so that it proceeds toward focusing mirror 20 in a wider path and is reflected back down toward polarizing beam splitter 16. Lens 22 makes the appropriate corrections in the reflected visible light, and quarter-wave plate 23 changes the polarization orientation of the reflected visible light by about 90° during the upward and downward passes of the reflected visible light through quarter-wave plate 23. The polarization of the visible light passing back down through quarter-wave plate 23 is then oriented 90° relative to its upward passage through polarizing beam splitter 16 so that it is split at the splitting plane 17 of polarizing beam splitter 16, and as shown by lines 31, the split-off portion of the downwardly directed visible light is directed onto reticle 15 where wafer 25 is imaged.

The preferred wavelength range of visible light for illuminating wafer 25 is broad enough to give some color vision, and an observer viewing the image of wafer 25 on reticle 15 through microscope 32 sees some color patterns that aid in adjusting wafer 25 to exact registry with reticle 15. This can be done by moving adjustable holder 34, and can also be done by moving a similar holder for reticle 15.

When registration of wafer 25 and reticle 15 is satisfactory, mirror 29 is removed from the light path or source 26 is shuttered so that no light from source 26 enters the system, and light source 26 can be extinguished if desired. Optical wedge 21 is then adjusted to the proper position for the particular photoresist material to be exposed on wafer 25, and carriage 33 is moved to position mirror 14 in front of reticle 15. Then shutter 12 is opened for a predetermined exposure interval to direct ultra violet or near ultra violet radiant energy from mercury arc source 11 through reticle 15 and onto wafer 25 to expose the image of reticle 15 onto wafer 25. With the relatively broad wavelength capabilities of printer 10, and with effective use of nearly half of the available energy from source 11, the exposure time can be on the order of 15 seconds.

The radiant energy from source 11 proceeds along axis 13 and is incident on splitting plane 17 of polarizing beam splitter 16 where approximately half of the energy is both polarized and reflected upward along axis 19. In passing up to focusing mirror 20 and back, the polarized radiant energy is corrected by lens 22, and quarter-wave plate 23 alters the polarization orientation 90° relative to the polarization of the radiant energy leaving beam splitter 16. Then the downwardly directed radiant energy is oriented to pass straight through splitting plane 17, and is made telecentrically incident on wafer 25 by lens 22 for an accurate exposure of the photoresist coating. When the exposure is completed, shutter 12 is closed and a new wafer is registered with a reticle by repeating the process.

Printer 10 has the capacity for printing microcircuits on wafers 25 up to three inches in diameter with high accuracy and reasonable speed, and also provides for accurate optical registration so that the resulting circuits are functionally reliable. Registration is convenient and rapid by using the preferred registration system, and an operator can achieve relatively high production by quickly registering and printing wafers in succession. Reticles 15 are not damaged in the process and seldom have to be replaced so that a great saving is achieved in reticle production. Also the resulting circuits are more accurate and reliable than was previously possible with either contact printing or prior art projection printing.

The optical components of printer 10 can be formed of various materials and designed to various parameters, all as is generally known in the optical designing art, and those skilled in this art will be able to apply the suggestions of the invention successfully as explained with no more than ordinary optical design requirements. The optical elements and their coatings must all transmit the desired wavelengths of radiant energy for accommodating both the ultra violet and near ultra violet energy from source 11 and the longer wavelength visible energy from source 26, and the optical path length is preferably adjustable as explained to accommodate different wavelengths of energy. Also, polarizing beam splitter 16 is preferably non-square as illustrated. All of the particulars as to holders, carriages, mirrors, shutters, and means for moving wedges or mirrors or positioning plates are all within the skill of optical designers and have been omitted to simplify the description of the invention.

Persons wishing to practice the invention should remember that other embodiments and variations can be adapted to particular circumstances. Even though one point of view is necessarily chosen in describing and defining the invention, this should not inhibit broader or related embodiments going beyond the semantic orientation of this application but falling within the spirit of the invention.

We claim:

1. In a projection printer for printing a circuitry pattern from a reticle onto a wafer and including an ultra violet source of radiant energy, a beam splitter, a focusing mirror and means for mounting and optically registering said reticle and said wafer respectively in input and output regions of said beam splitter, the improvement comprising:

a. said beam splitter is a polarizing beam splitter directing a polarized portion of said radiant energy toward said focusing mirror;

b. means between said polarizing beam splitter and said focusing mirror for altering said polarization of said radiant energy so said polarization of said radiant energy reflected from said focusing mirror is oriented to pass straight through said polarizing beam splitter to said wafer;

c. a multi-element corrective lens arranged between said polarizing beam splitter and said focusing mirror for correcting chromatic and spherical aberration, astigmatism and field curvature and directing said radiant energy reflected from said focusing mirror substantially telecentrically onto said wafer;

d. said polarizing beam splitter, said polarization altering means and said lens being selected for substantially transmitting said radiant energy throughout the near ultra violet and visible spectrum;

e. said optical registering means including a source of polarized visible radiant energy and a microscope arranged for observing said reticle;

f. means for directing said polarized visible radiant energy toward said polarizing beam splitter to pass through said polarization altering means so the polarization of said visible radiant energy is oriented to pass straight through said polarizing beam splitter to be substantially telecentrically incident on said wafer, said visible radiant energy being reflected to said focusing mirror from said wafer and said visible radiant energy reflected back from said focusing mirror being oriented by said polarization altering means to be split by said polarizing beam splitter for imaging said wafer on said reticle for viewing through said microscope; and g. adjustable means for varying the optical length of the path between said focusing mirror and said wafer to accommodate different wavelengths of said radiant energy from said ultra violet source and said source of visible radiant energy.

2. The printer of claim 1 wherein said polarization altering means is a quarter-wave plate.

3. The printer of claim 1 wherein said means for varying the optical path length is an optical wedge adjacent said polarizing beam splitter.

4. The printer of claim 3 wherein said optical wedge is also adjustable to accommodate different wavelengths of light from said ultra violet source.

5. The printer of claim 1 wherein said means for directing said visible radiant energy includes a retractable mirror off the axis of the path from said polarizing beam splitter to said focusing mirror.

6. The printer of claim 1 including a polarizer and a quarter-wave plate arranged for circularly polarizing said visible radiant energy.

7. The printer of claim 6 wherein said polarization altering means is a quarter-wave plate altering said circularly polarized visible radiant energy to plane polarized visible radiant energy.

8. The printer of claim 1 wherein said microscope is movable and including a mirror movable with said microscope for directing said radiant energy from said ultra violet source through said reticle when said microscope is not arranged for observing said reticle.

9. The printer of claim 1 wherein said polarizing beam splitter has a non-square configuration, and the plane of said reticle and the plane of said wafer are angled obtusely from each other.

10. The printer of claim 9 wherein said means for varying the optical path length is an optical wedge adjacent said polarizing beam splitter.

11. The printer of claim 10 wherein said optical wedge is also adjustable to accommodate different wavelengths of light from said ultra violet source.

12. The printer of claim 10 wherein said polarization altering means is a quarter-wave plate.

13. The printer of claim 12 wherein said means for directing said visible radiant energy includes a retractable mirror off the axis of the path from said polarizing beam splitter to said focusing mirror.

14. The printer of claim 13 including a polarizer and a quarter-wave plate arranged for circularly polarizing said visible radiant energy.

15. The printer of claim 14 wherein said microscope is movable and including a mirror movable with said microscope for directing said radiant energy from said ultra violet source through said reticle when said microscope is not arranged for observing said reticle.

* * * * *